(12) United States Patent
Gossner et al.

(10) Patent No.: US 11,424,354 B2
(45) Date of Patent: Aug. 23, 2022

(54) GROUP III-NITRIDE SILICON CONTROLLED RECTIFIER

(71) Applicant: Intel Corporation, Santa Clara, CA (US)

(72) Inventors: Harald Gossner, Riemerling (DE); Peter Baumgartner, Munich (DE); Uwe Hodel, Putzbrunn (DE); Domagoj Siprak, Munich (DE); Stephan Leuschner, Munich (DE); Richard Geiger, Munich (DE)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 16/642,867

(22) PCT Filed: Sep. 29, 2017

(86) PCT No.: PCT/US2017/054633
§ 371 (c)(1),
(2) Date: Feb. 27, 2020

(87) PCT Pub. No.: WO2019/066975
PCT Pub. Date: Apr. 4, 2019

(65) Prior Publication Data
US 2020/0203518 A1 Jun. 25, 2020

(51) Int. Cl.
*H01L 29/778* (2006.01)
*H01L 29/66* (2006.01)
*H01L 29/20* (2006.01)

(52) U.S. Cl.
CPC ...... *H01L 29/7783* (2013.01); *H01L 29/2003* (2013.01); *H01L 29/66462* (2013.01)

(58) Field of Classification Search
None
See application file for complete search history.

(56) References Cited

U.S. PATENT DOCUMENTS

| 9,337,278 B1 * | 5/2016 | Gu .......................... H01L 24/32 |
| 2001/0023964 A1 | 9/2001 | Wu et al. |

(Continued)

OTHER PUBLICATIONS

International Preliminary Report on Patentability from PCT/US2017/054633 notified Apr. 9, 2020, 8 pgs.

(Continued)

*Primary Examiner* — Grant S Withers
(74) *Attorney, Agent, or Firm* — Essential Patents Group, LLP

(57) ABSTRACT

A Group III-Nitride (III-N) device structure is provided comprising: a heterostructure having three or more layers comprising III-N material, an anode n+ region and a cathode comprising donor dopants, wherein the anode n+ region and the cathode are on the first layer of the heterostructure and wherein the anode n+ region and the cathode extend beyond the heterostructure, and an anode metal region within a recess that extends through two or more of the layers, wherein the anode metal region is in electrical contact with the first layer, wherein the anode metal region comprises a first width within the recess and a second width beyond the recess, and wherein the anode metal region is coupled with the anode n+ region. Other embodiments are also disclosed and claimed.

20 Claims, 6 Drawing Sheets

(56) References Cited

U.S. PATENT DOCUMENTS

| | | | |
|---|---|---|---|
| 2008/0105902 A1* | 5/2008 | Twynam | H01L 29/861 |
| | | | 257/E29.253 |
| 2009/0072240 A1* | 3/2009 | Suh | H01L 29/7787 |
| | | | 257/E21.403 |
| 2009/0206371 A1* | 8/2009 | Oka | H01L 29/4236 |
| | | | 257/201 |
| 2010/0207166 A1 | 8/2010 | Zhu | |
| 2011/0068371 A1* | 3/2011 | Oka | H01L 29/66462 |
| | | | 257/E29.188 |
| 2013/0092958 A1 | 4/2013 | Chen et al. | |
| 2014/0054603 A1 | 2/2014 | Wu et al. | |
| 2015/0214327 A1 | 7/2015 | Decoutere et al. | |
| 2016/0336437 A1* | 11/2016 | Kajitani | H01L 29/7784 |
| 2017/0110598 A1* | 4/2017 | Chen | H01L 29/402 |

OTHER PUBLICATIONS

International Search Report and Written Opinion from PCT/US2017/054633 dated Jun. 29, 2018, 11 pgs.

* cited by examiner

GROUP III-NITRIDE SILICON CONTROLLED RECTIFIER

CLAIM OF PRIORITY

This Application is a National Stage Entry of, and claims priority to, PCT Patent Application No. PCT/US2017/054633, filed on Sep. 29, 2017 and titled "GROUP III-NITRIDE SILICON CONTROLLED RECTIFIER", which is incorporated by reference in its entirety for all purposes.

BACKGROUND

Diodes are a common circuit element used in integrated circuits (ICs). Diodes are useful for protecting circuitry from over-voltages, such as those associated with electrostatic discharge (ESD) events. Absent a protection circuit, discharge through a device such as a transistor, can cause catastrophic damage to an IC. Diodic protection circuits may therefore be configured as part of a functional IC to shunt surges in potential away from circuitry that could otherwise be damaged. Group III-Nitride (IUPAC 13-N) semiconductor materials offer the benefit of a relatively wide bandgap (~3.4 eV), enabling higher breakdown voltages than Si-based devices. Group III-Nitride (III-N) semiconductor materials also offer high carrier mobility. However, III-N diodes with sufficiently low on-resistance tend to be an area-intensive circuit element even when monolithically integrated with transistors of an IC.

III-N diode structures enabling a smaller area are therefore advantageous at least for enabling dimensional scaling of the device platforms that employ them.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
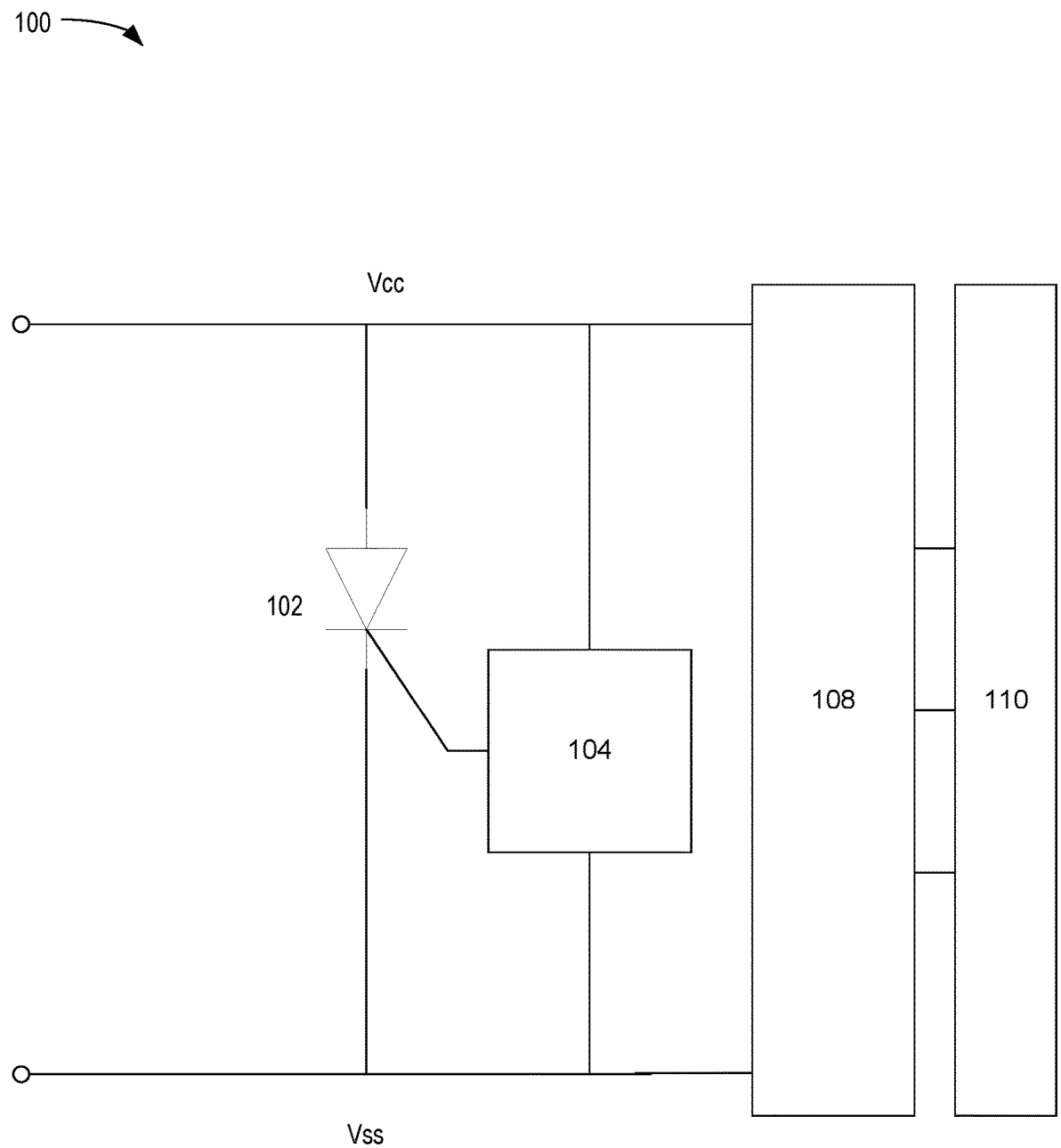
FIG. 1 is a schematic of a silicon controlled rectifier circuit, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1 is schematic of an example electrical circuit 100 including at least one III-N heterojunction silicon controlled rectifier (SCR). As shown, circuit 100 includes SCR 102, gate trigger circuit 104, power converter 108, and load 110. Circuit 100 may be implemented in any electronic device, such as, but not limited to, smartphones, ultrabook computers, embedded devices (e.g., internet of things, automotive applications, etc.), or wearables. In circuit 100, SCR 102, along with gate trigger circuit 104 may act as a crowbar circuit to protect power converter 108 and load 110 from over-current conditions. Power converter 108 includes a first terminal (e.g., anode n+ region) coupled to a first supply rail maintained at a nominal supply voltage (e.g., $V_{cc}$), and a second terminal (e.g., cathode) coupled to second supply rail maintained at a nominal reference voltage (e.g., $V_{ss}$). Load 110 may represent any type of circuitry or component that may be sensitive to overvoltage conditions. In some embodiments, load 110 may include a transceiver or communication circuit, for example.

Under normal operating conditions, SCR 102 is maintained in the off-state such that current in circuit 100 is flowing through power converter 108. However, upon experiencing a potential surge in current, in excess of a preset value, gate trigger circuit 104 will turn on SCR 102, creating a short-circuit that will bypass power converter 108. Such SCR device structures may have one or more of the features described further below. Any of the III-N heterostructure devices described further herein may also be employed in any other suitable protection circuit designs. Any of the III-N heterostructure devices described further herein may also be employed in circuits having functions other than high voltage power management circuitry, such as, but not limited to, ESD protection.

Figure 2:
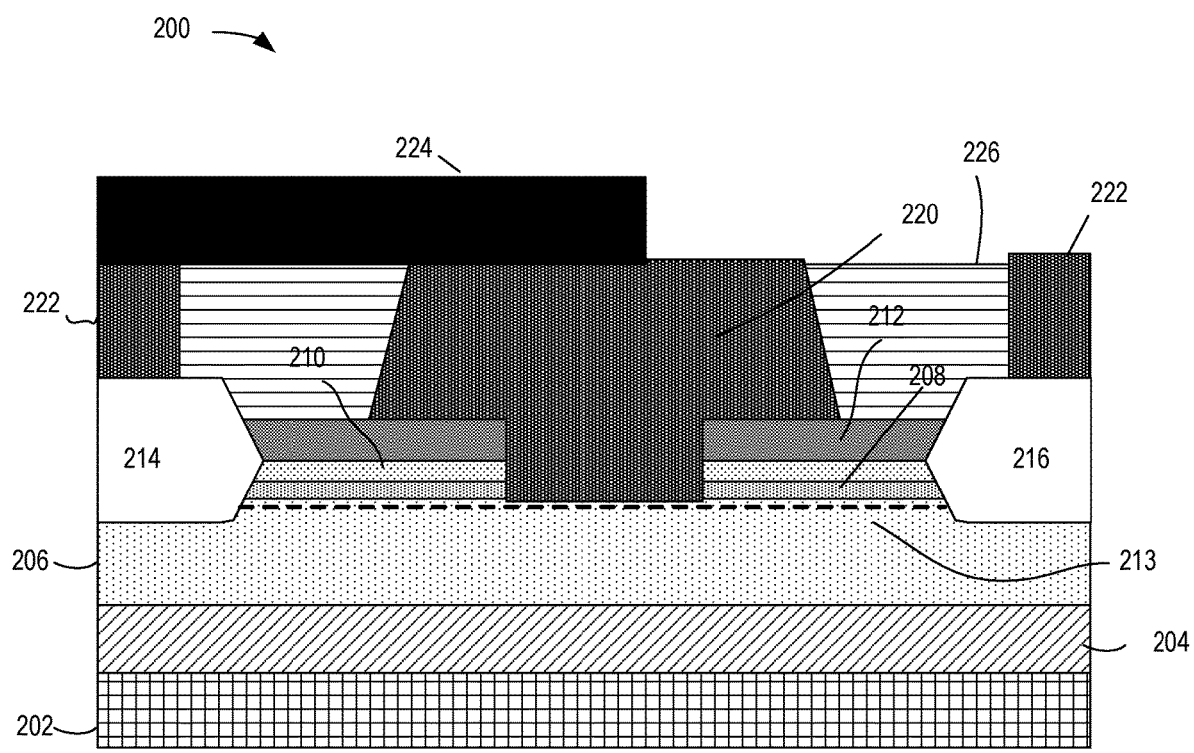
FIG. 2 is a cross-sectional view an exemplary III-N heterojunction silicon controlled rectifier structure, in accordance with some embodiments.

FIG. 2 is a cross-sectional view an exemplary III-N heterojunction silicon controlled rectifier structure, in accordance with some embodiments. As shown in FIG. 2, device 200 may include substrate 202, buffer layer 204, channel layer 206, polarization layer 208, barrier layer 210, capping layer 212, two-dimensional charge carrier sheet 213 (e.g., 2D electron gas or "2DEG"), anode n+ region 214, cathode 216, anode metal region 220, contact metal 222, interconnect metal 224 and spacer material 226.

In some embodiments, substrate 202 may be a SiC substrate. In other embodiments, substrate 202 is a cubic semiconductor, such as monocrystalline silicon. For such embodiments, template structures may be formed on a cubic substrate surface, such as a (100) surface. III-N crystals may also be grown on other surfaces (e.g., 110, 111, miscut or offcut, for example 2-10° toward [110] etc.). In some embodiments, substrate 202 may be material upon which the III-N crystal has been bonded, in which case substrate 202 may be crystalline, or not (e.g., glass, polymer, etc.).

Buffer layer 204 may be present to buffer channel layer 206 from substrate 202. In some embodiments, buffer layer 204 may include AlN or AlGaN, or other III-N or other materials chosen to differentiate from the material used for channel layer 206.

In some embodiments, a III-N heterostructure may include channel layer 206, polarization layer 208, and barrier layer 210. Polarization layer 208 comprises an alloy distinct from the alloy of channel layer 206, thereby inducing a variation in the polarization field strength (e.g., spontaneous and/or piezoelectric) between these two III-N layers. Where spontaneous and/or piezoelectric polarization field strengths are sufficiently different between polarization layer 208 and III-N channel layer 206, 2DEG 213 is formed within channel layer 206 in the absence of any externally applied field.

For some exemplary embodiments having Ga-polarity, polarization layer 208 has a higher Al content than III-N channel layer 206. Polarization layer 208 may be binary AlN. Polarization layer 208 may also be an AlGaN alloy. Exemplary AlGaN embodiments include 25-40% Al ($Al_xGa_{1-x}N$ where $0.25 \le x \le 0.4$). Polarization layer 208, or barrier layer 210, may also be an InAlN alloy or a quaternary alloy, which are also suitable as a polarization material and may offer advantages with respect to tuning the lattice constant to better match that of one or more other material layers (e.g., layers 206 and/or 210). Exemplary InAlN embodiments include less than 20% In ($In_xAl_{1-x}N$ where $0.25<x \le 0.2$), with 17% In having the advantage of an exceptional lattice match with binary GaN. Exemplary quaternary alloys include $In_xGa_yAl_{1-x-y}N$ with $0<x \le 0.2$ and $0<y \le 0.2$.

In some embodiments, III-N channel layer 206 may be binary GaN. III-N channel layer 206 may also be an AlGaN or InAlN alloy, or even a quaternary alloy, as long as the polarization field strength difference between layers 206 and 208 is sufficient to induce formation of 2DEG 213.

In some advantageous embodiments, at least III-N channel layer 206 is intrinsic and not intentionally doped with impurities associated with a particular conductivity type. Channel layer 206 in the intrinsic state can be expected to have higher charge carrier mobility than is possible for a material of higher impurity doping. Intrinsic impurity (e.g., Si) levels in channel layer 206 are advantageously less than 1e17 atoms/cm$^3$, and in some exemplary embodiments is between 1e14 and 1e16 atoms/cm$^3$.

In some embodiments, capping layer 212 may be included over barrier layer 210, while in other embodiments, capping layer 212 is not present. In some embodiments, where present, capping layer 212 may include dielectric material, such as an oxide, or another III-N material, for example.

Anode metal region 220 may be formed in a recess extending through two or more III-N heterostructure layers. As shown, anode metal region 220 may contact channel layer 206. In some embodiments, anode metal region 220 may include a narrower gate width within a III-N heterostructure recess and a wider gate width over the III-N heterostructure. The degree to which upper gate width overhangs the III-N heterostructure may be adjusted for a desired capacitance.

The composition of anode metal region 220 may be selected based on the metal-semiconductor workfunction difference relative to III-N channel layer 206 to achieve a desired transistor threshold voltage. In some embodiments, where III-N channel layer 206 is binary GaN, anode metal region 220 advantageously includes at least one of Ni, W, Pt, or TiN. Each of these metals or metallic compounds may be associated with a particular work function (or metal-semiconductor work function difference) that has an impact transistor threshold voltage. Although anode metal region 220 is illustrated as homogeneous, a stack or laminate of metals may also be employed.

As shown in FIG. 2, anode n+ region 214 and cathode 216 are within recesses in the III-N heterostructure that are located on opposite sides of anode metal region 220. The anode n+ region and cathode recesses also extend through III-N barrier layer 210, and polarization layer 208, landing on III-N channel layer 206. In the illustrated example, anode n+ region 214 and cathode 216 are in physical contact with a c-plane (e.g., Ga-face) of III-N channel layer 206. Anode n+ region 214 and cathode 216 have access to an edge thickness of 2DEG 213 buried below the heterojunction between polarization layer 208 and III-N channel layer 206. One skilled in the art would appreciate that a direct (or substantially direct) connection between 2DEG 213 and cathode 216 would to tend to reduce on resistance of the associated Schottky diode, thereby enhancing ESD protection. The junction between III-N channel layer 206 and anode n+ region 214 and cathode 216 may be a heterojunction with the composition of anode n+ region 214 and cathode 216 being distinct from that of at least III-N channel layer 206. In some embodiments, anode n+ region 214 and cathode 216 are also a III-N material. For example, anode n+ region 214 and cathode 216 may be InGaN. Some advantageous InGaN embodiments include 5-20% In ($In_xGa_{1-x}N$ with 5%≤x≤20%). The alloy composition of anode n+ region 214 and cathode 216 may be constant or graded between III-N channel layer 206 and contact metal 222. For some embodiments, anode n+ region 214 and cathode 216 are epitaxial, having the same crystallinity and orientation as III-N channel layer 206.

Anode n+ region 214 and cathode 216 advantageously include impurity dopants to have a first conductivity type (e.g., Si donor impurities for n-type conductivity). The doping level of anode n+ region 214 and cathode 216 is advantageously as high as practical for lowest transistor terminal resistance. In some exemplary embodiments where anode n+ region 214 and/or cathode 216 is a III-N alloy, the impurity dopant level is over 1e19 atoms/$cm^3$, and more advantageously over 1e20 atoms/$cm^3$. Si is one exemplary dopant atom for which such high (N+) doping levels may be achieved in III-N alloys. An alternative N-type dopant is Ge.

For embodiments where anode n+ region 214 and cathode 216 have n-type conductivity, contact metal 222 may be any suitable metal, such as at least one of Ti, Al, or W, for example. Other metals known to make ohmic contacts to n-type III-N materials may be suitable alternatives for making ohmic contact to anode n+ region 214 and cathode 216.

Interconnect metal 224 may electrically couple anode metal region 220 and anode n+ region 214, forming a united anode. In some embodiments, interconnect metal 224 may be copper or another metal suitable for interconnect formation. While shown as being present at a bottom or M0 interconnect layer, interconnect metal 224 may couple anode metal region 220 and anode n+ region 214 at a higher interconnect layer.

Spacer material 226 may be any low-k (e.g., bulk permittivity of 3, or less) or conventional dielectric material (e.g., bulk permittivity of 3.5-8) known to be suitable for the purpose of insulating anode metal regions from nearby metals.

Figure 3:
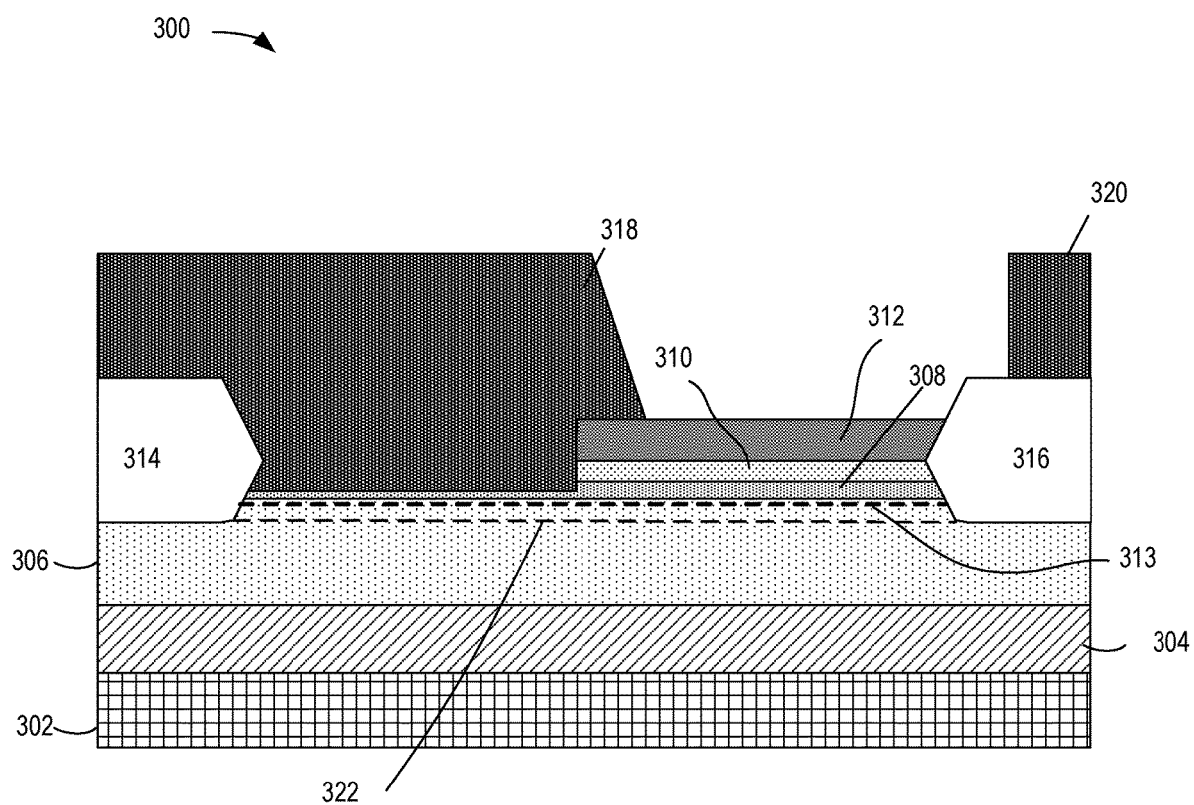
FIG. 3 is a cross-sectional view an exemplary III-N heterojunction silicon controlled rectifier structure, in accordance with some embodiments.

FIG. 3 is a cross-sectional view an exemplary III-N heterojunction silicon controlled rectifier structure, in accordance with some embodiments. As shown in FIG. 3, device 300 may include substrate 302, barrier layer 304, channel layer 306, polarization layer 308, barrier layer 310, capping layer 312, 2DEG 313, anode n+ region 314, cathode 316, anode metal region 318, contact metal 320, and delta doping layer 322. Device 300 may include many of the same features previously presented in reference to device 200.

In some embodiments, channel layer 306 includes delta doping layer 322, which may increase the presence of charge carriers by introducing dopants, such as silicon, during the epitaxial growth of channel layer 306. As shown, anode metal region 318 may reside in a recess that only partially extends through polarization layer 308. In some embodiments, anode metal region 318 may be separated from channel layer 306 by about a 1-3 nm portion of polarization layer 308. Also, anode metal region 318 may extend laterally into contact with anode n+ region 314, from above and sideways, without III-N heterostructure material between them.

Figure 4:
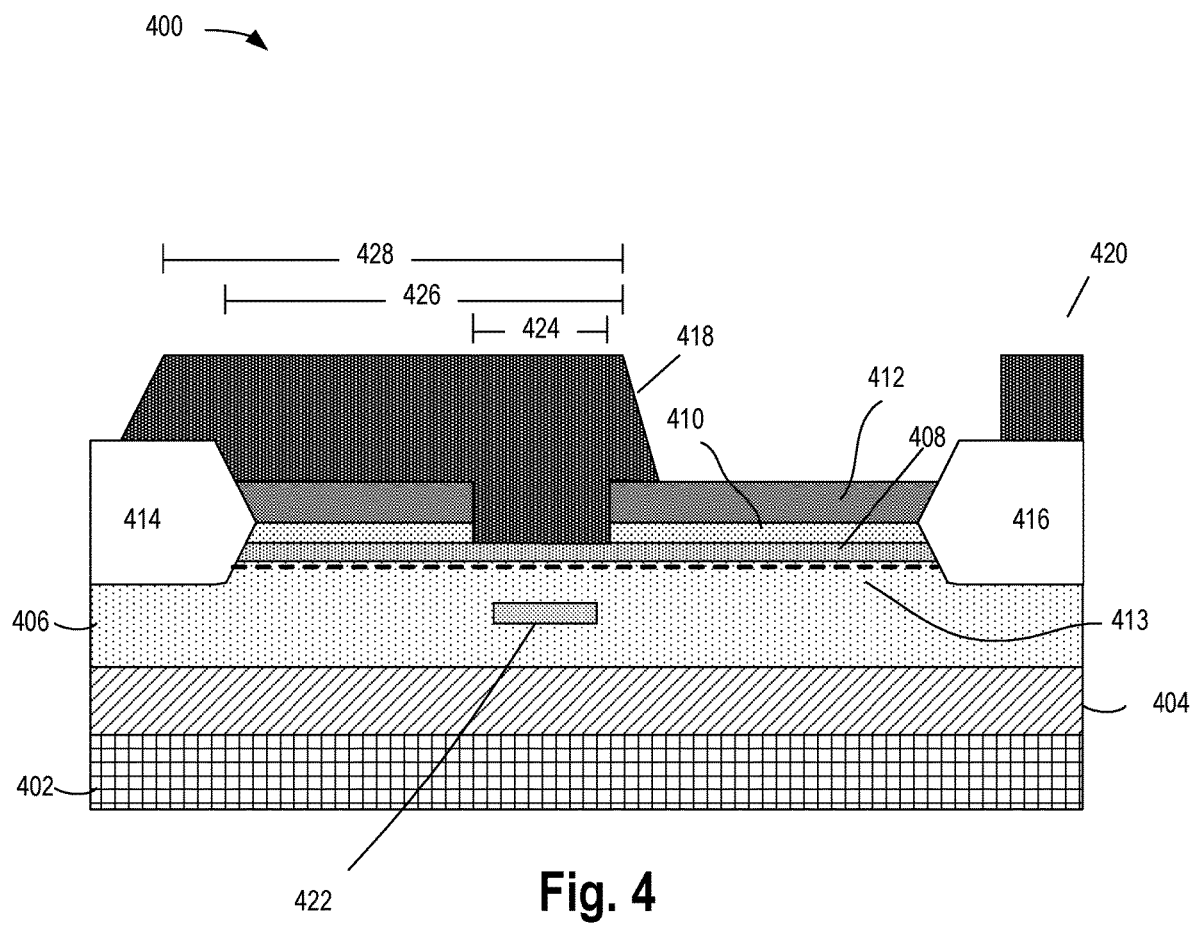
FIG. 4 is a cross-sectional view an exemplary III-N heterojunction silicon controlled rectifier structure, in accordance with some embodiments.

FIG. 4 is a cross-sectional view an exemplary III-N heterojunction silicon controlled rectifier structure, in accordance with some embodiments. As shown in FIG. 4, device 400 may include substrate 402, barrier layer 404, channel layer 406, polarization layer 408, barrier layer 410, capping layer 412, 2DEG 413, anode n+ region 414, cathode 416, anode metal region 418, contact metal 420, implant doping layer 422, first gate width 424, second gate width 426, and third gate width 428. Device 400 may include many of the same features previously presented in reference to devices 200 and 300. In some embodiments, channel layer 406 includes implant doping layer 422, which may include silicon doping for an increased presence of charge carriers.

As shown, anode metal region 418 may contact a surface of polarization layer 408 and may include first gate width 424 within the heterostructure, second gate width 426 above the heterostructure, and third gate width 428 above anode n+ region 414.

Figure 5:
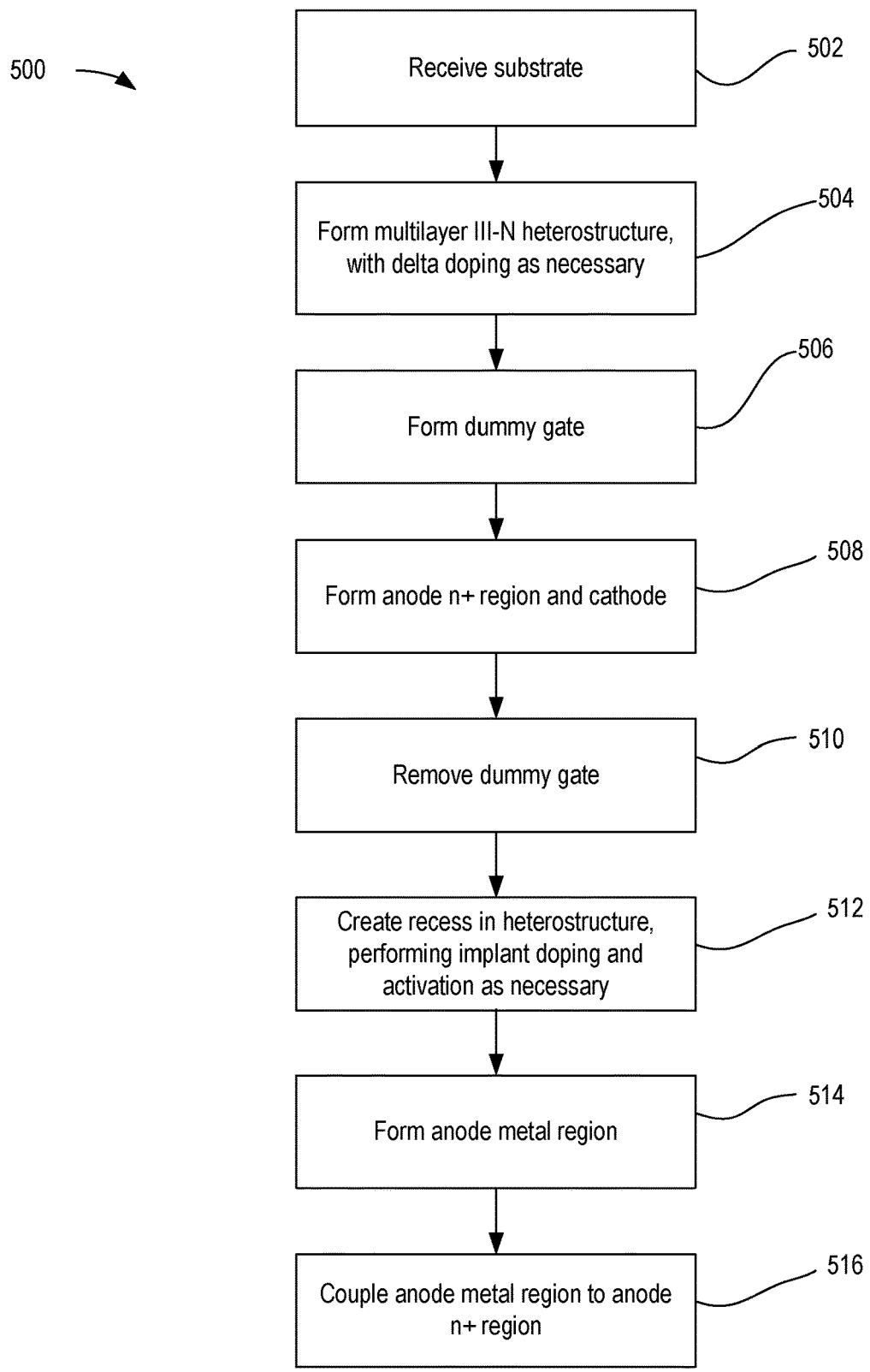
FIG. 5 is a flow diagram illustrating methods of forming III-N heterojunction silicon controlled rectifier structures, in accordance with some embodiments.

The III-N devices described above may be fabricated using a variety of methods. FIG. 5 is a flow diagram illustrating methods 500 for forming a III-N heterojunction silicon controlled rectifier, in accordance with some embodiments. Methods 500 begin at operation 502 where a substrate including a crystalline seed layer is received. The substrate received at operation 502 may be any of those described above, for example. At operation 504, a III-N epitaxial growth process is employed to grow a crystalline Ga-polar III-N heterostructure on the substrate seeding surface. The heterostructure grown induces the formation of a 2D charge carrier sheet. In some embodiments, delta doping is included in the epitaxial growth of a channel layer. The epitaxial growth performed at operation 504 may form a continuous crystal over an entire surface of a substrate, or may be limited to islands or mesas occupying only a portion of a substrate surface as controlled through a templating pattern. Alternatively, a Ga-face of a III-N crystal grown with any polarity is exposed at operation 504. For example, a III-N crystal may be first grown with N-polarity over a substrate, and the substrate then removed to expose the Ga-face to subsequent processing.

At operation 506, a dummy gate may be formed by any suitable method to define a location for an eventual anode metal region. In some embodiments, a poly-silicon dummy gate may be formed. Methods 500 continue at operation 508 where anode n+ region and cathode semiconductor is formed in a manner that ensures the anode n+ region and cathode semiconductor are coupled to the 2D charge carrier sheet present within the heterostructure. The formation process may further entail forming a recess through layers of the III-N heterostructure and deposition or growth of semiconductor within the recess. Any patterning techniques may be employed to form the recess and any epitaxial growth technique or deposition process may be employed, for example to form any of the anode n+ region and cathode semiconductor compositions described above.

Methods 500 continue at operation 510 where the dummy gate may be removed by any etch or ablation techniques. At operation 512, a recess may be created in the heterostructure in which the gate will be formed and implant doping and activation may be performed. Methods 500 continue at operation 514 where an anode metal region is formed in a manner that ensures the anode metal region will be coupled (e.g., with rectification) to the 2D charge carrier sheet. Any deposition process(es) suitable for the chosen anode metal region may be employed. For example, one or more of physical vapor deposition, chemical vapor deposition, or atomic layer deposition may be employed to deposit one or more gate dielectric layer and one or more the metal or metallic compound, such as any of those described elsewhere herein. Finally, to the extent the formation of the anode metal region did not couple with the anode n+ region or cathode, at operation 516 a united anode is formed by coupling the anode metal region to the anode n+ region or cathode, perhaps through an interconnect metal routing.

Figure 6:
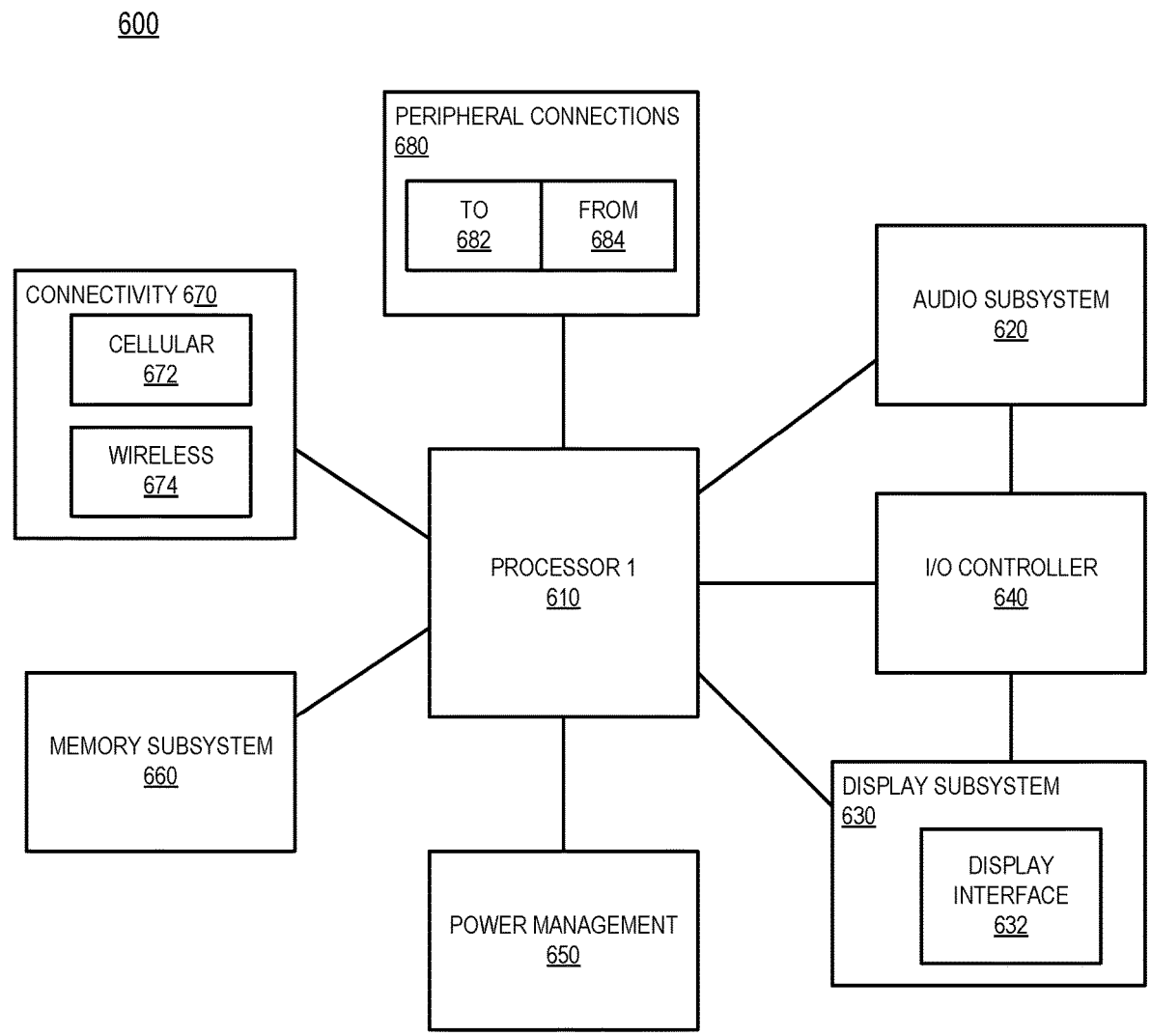
FIG. 6 illustrates a smart device or a computer system or a SoC (System-on-Chip) which includes a III-N heterojunction silicon controlled rectifier structure, in accordance with some embodiments.

FIG. 6 illustrates a smart device or a computer system or a SoC (System-on-Chip) which includes a III-N heterojunction silicon controlled rectifier structure, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example cellular 672 and/or wireless 674, include a III-N heterojunction silicon controlled rectifier structure as described above, for example coupled with a transceiver.

For purposes of the embodiments, the transistors in various circuits and logic blocks described here are metal oxide semiconductor (MOS) transistors or their derivatives, where the MOS transistors include cathode, anode n+ region, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical anode n+ region and cathode terminals i.e., are identical terminals and are interchangeably used here. A TFET device, on the other hand, has asymmetric Anode n+ region and Cathode terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one example, a Group III-Nitride (III-N) device structure is provided comprising: a heterostructure having three or more layers comprising III-N material; an anode n+ region and a cathode comprising donor dopants, wherein the anode n+ region and the cathode are on the first layer of the heterostructure and wherein the anode n+ region and the cathode extend beyond the heterostructure; and an anode metal region within a recess that extends through two or more of the layers, wherein the anode metal region is in electrical contact with the first layer, wherein the anode metal region comprises a first width within the recess and a second width beyond the recess, and wherein the anode metal region is coupled with the anode n+ region.

In some embodiments, the first layer of the heterostructure comprises GaN and a second layer of the heterostructure comprises AlN. Some embodiments also include donor dopants in the first layer of the heterostructure comprising a delta doping layer or an implant doping layer. In some embodiments, the anode metal region is separated from the first layer of the heterostructure by about a 1-3 nm portion of the second layer of the heterostructure. In some embodiments, the anode metal region comprises Ni. In some embodiments, the second width of the anode metal region comprises an overhang over one or more layers of the heterostructure that extends into contact with the anode n+ region. In some embodiments, the anode metal region comprises a third width that extends over the anode n+ region. In some embodiments, the anode metal region is coupled with the anode n+ region through an interconnect layer.

In another example, a computer platform is provided comprising: one or more transceiver; a processor communicatively coupled to the transceiver; and an antenna coupled to the transceiver, wherein the transceiver is coupled to a III-N device comprising: a heterostructure having three or more layers comprising III-N material; an anode n+ region and a cathode comprising donor dopants, wherein the anode n+ region and the cathode are on the first layer of the heterostructure and wherein the anode n+ region and the cathode extend beyond the heterostructure; and an anode metal region within a recess that extends through two or more of the layers, wherein the anode metal region is in electrical contact with the first layer, wherein the anode metal region comprises a first width within the recess and a second width beyond the recess, and wherein the anode metal region is coupled with the anode n+ region.

In some embodiments, the first layer of the heterostructure comprises GaN and a second layer of the heterostructure comprises AlN. Some embodiments also include donor dopants in the first layer of the heterostructure comprising a delta doping layer or an implant doping layer. In some embodiments, the anode metal region is separated from the first layer of the heterostructure by about a 1-3 nm portion of the second layer of the heterostructure. In some embodiments, the anode metal region comprises Ni. In some embodiments, the second width of the anode metal region comprises an overhang over one or more layers of the heterostructure that extends into contact with the anode n+ region. In some embodiments, the anode metal region comprises a third width that extends over the anode n+ region. In some embodiments, the anode metal region is coupled with the anode n+ region through an interconnect layer.

In another example, a method of forming a Group III-Nitride (III-N) device structure is provided comprising: forming a heterostructure comprising three or more III-N material layers; forming an anode n+ region and a cathode semiconductor on the first layer of the heterostructure, wherein the anode n+ region and cathode comprise donor dopants, and wherein the anode n+ region and cathode extend beyond the heterostructure; and forming an anode metal region within a recess that extends through two or more of the layers, wherein the anode metal region is in electrical contact with the first layer, wherein the anode metal region comprises a first width within the recess and a second width beyond the recess, and wherein the anode metal region is coupled with the anode n+ region.

In some embodiments, forming the heterostructure comprising forming the first layer of the heterostructure comprising GaN and forming a second layer of the heterostructure comprising AlN. Some embodiments also include forming donor dopants in the first layer of the heterostructure comprising delta doping or an implant doping. In some embodiments, forming the anode metal region comprising forming the anode metal region separated from the first layer of the heterostructure by about a 1-3 nm portion of the second layer of the heterostructure. In some embodiments, forming the anode metal region comprises forming an anode metal region comprising Ni. In some embodiments, forming the anode metal region comprises forming an overhang over one or more layers of the heterostructure that extends into contact with the anode n+ region. In some embodiments, forming the anode metal region comprises forming a third width that extends over the anode n+ region. In some embodiments, forming the anode comprises coupling the anode metal region with the anode n+ region through an interconnect layer.

In another example, a Group III-Nitride (III-N) device structure is provided comprising: a heterostructure having three or more layers comprising III-N material, wherein a first layer of the heterostructure comprises donor dopants; an anode consisting of a metal region within a recess that extends through two or more of the layers, wherein the anode is in electrical contact with the first layer and a donor doped region comprising III-N material on the first layer; a cathode comprising donor dopants, wherein the cathode is on the first layer of the heterostructure; and a conducting region in the first layer in direct contact to the cathode and conductively connected to the anode.

In some embodiments, the conducting region in the first layer is formed by polarization fields of a second layer. In some embodiments, a Schottky barrier is formed between the conducting region in the first layer and the anode. In some embodiments, the conducting region in the first layer and the anode extends below the anode. In some embodiments, the two regions of the anode are attached to each other. In some embodiments, the two regions of the anode are electrically connected by a metal layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. A Group III-Nitride (III-N) device structure, comprising:
   a heterostructure having three or more layers comprising III-N material;
   an anode n+ region and a cathode comprising donor dopants, wherein the anode n+ region and the cathode are in physical contact with a lower layer of the heterostructure; and
   an anode metal within a recess between the anode n+ region and the cathode, wherein the recess extends into two or more layers of the heterostructure that are over the lower layer, wherein the anode metal at the bottom of the recess is in physical contact with one of the layers of the heterostructure that is exposed at a bottom of the recess, wherein the anode metal extends beyond the recess, and wherein the anode metal is in physical contact with the anode n+ region.

2. The III-N device structure of claim 1, wherein the lower layer of the heterostructure comprises GaN, and a second layer of the heterostructure comprises AlN.

3. The III-N device structure of claim 2, further comprising donor dopants in the lower layer of the heterostructure.

4. The III-N device structure of claim 2, wherein the anode metal is separated from the lower layer of the heterostructure by a 1-3 nm portion of the second layer of the heterostructure.

5. The III-N device structure of claim 1, wherein the anode metal comprises Ni.

6. The III-N device structure of claim 1, wherein the anode metal comprises an overhang over one or more layers of the heterostructure that extends into contact with the anode n+ region.

7. The III-N device structure of claim 1, wherein the recess exposes a portion of the anode n+ region and the anode metal is in physical contact with the portion of the anode n+ region exposed by the recess.

8. The III-N device structure of claim 1, wherein the anode metal is coupled with the anode n+ region through an overlying interconnect layer that is in direct contact with each of the anode metal and a contact metal that is further in contact with the n+ region, the interconnect layer having a different composition than the anode metal and the contact metal.

9. A computer platform comprising:
   one or more transceiver;
   a processor communicatively coupled to the transceiver; and
   an antenna coupled to the transceiver, wherein the transceiver is coupled to a III-N device comprising:

a heterostructure having three or more layers comprising III-N material;
an anode n+ region and a cathode comprising donor dopants, wherein the anode n+ region and the cathode are in physical contact with a lower layer of the heterostructure; and
an anode metal within a recess between the anode n+ region and the cathode, wherein the recess extends into two or more layers of the heterostructure that are over the lower layer, wherein the anode metal at the bottom of the recess is in physical contact with one of the layers of the heterostructure that is exposed at a bottom of the recess, wherein the anode metal extends beyond the recess, and wherein the anode metal is in physical contact with the anode n+ region.

10. The computer platform of claim 9, wherein the first layer of the heterostructure comprises GaN and a second layer of the heterostructure comprises AlN.

11. The computer platform of claim 9, further comprising donor dopants in the first layer of the heterostructure.

12. The computer platform of claim 10, wherein the anode metal region is separated from the lower layer of the heterostructure by a 1-3 nm portion of the second layer of the heterostructure.

13. The computer platform of claim 9, wherein the anode metal comprises Ni.

14. The computer platform of claim 9, wherein the anode metal comprises an overhang over one or more layers of the heterostructure that extends into contact with the anode n+ region.

15. The computer platform of claim 9, wherein the recess exposes a portion of the anode n+ region and the anode metal is in physical contact with the portion of the anode n+ region exposed by the recess.

16. The computer platform of any of claim 9, wherein the anode metal is coupled with the anode n+ region through an overlying interconnect layer that is in direct contact with each of the anode metal and a contact metal that is further in contact with the n+ region, the interconnect layer having a different composition than the anode metal and the contact metal.

17. A method of forming a Group III-Nitride (III-N) device structure, the method comprising:
forming a heterostructure comprising three or more III-N material layers;
forming an anode n+ region and a cathode semiconductor in physical contact with a lower layer of the heterostructure, wherein the anode n+ region and cathode comprise donor dopants; and
forming an anode metal within a recess between the anode n+ region and the cathode, wherein the recess extends into two or more layers of the heterostructure that are over the lower layer, wherein the anode metal at the bottom of the recess is in physical contact with one of the layers of the heterostructure that is exposed at a bottom of the recess, wherein the anode metal extends beyond the recess, and wherein the anode metal is in physical contact with the anode n+ region.

18. The method of claim 17, wherein forming the heterostructure comprising forming the first layer of the heterostructure comprising GaN and forming a second layer of the heterostructure comprising AlN.

19. The method of claim 18, further comprising forming donor dopants in the first layer of the heterostructure through delta doping or an implant doping.

20. The method of claim 18, wherein forming the anode metal comprises forming the anode metal in physical contact with the second layer and separated from the first layer of the heterostructure by a 1-3 nm portion of the second layer of the heterostructure.

* * * * *